United States Patent
Iino

(10) Patent No.: US 11,565,224 B2
(45) Date of Patent: Jan. 31, 2023

(54) METHOD AND APPARATUS FOR SUPPLYING WATER OF SPECIFIED CONCENTRATION

(71) Applicant: KURITA WATER INDUSTRIES LTD., Tokyo (JP)

(72) Inventor: Hideaki Iino, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 664 days.

(21) Appl. No.: 16/497,957

(22) PCT Filed: Sep. 15, 2017

(86) PCT No.: PCT/JP2017/033550
§ 371 (c)(1),
(2) Date: Sep. 26, 2019

(87) PCT Pub. No.: WO2018/179503
PCT Pub. Date: Oct. 4, 2018

(65) Prior Publication Data
US 2020/0316543 A1    Oct. 8, 2020

(30) Foreign Application Priority Data

Mar. 30, 2017  (JP) .............................. JP2017-068091

(51) Int. Cl.
*B01F 35/00* (2022.01)
*B01F 35/21* (2022.01)
(Continued)

(52) U.S. Cl.
CPC ........ *B01F 35/2132* (2022.01); *B01F 23/405* (2022.01); *B01F 25/30* (2022.01);
(Continued)

(58) Field of Classification Search
CPC .. B01F 2101/58; B01F 35/80; B01F 35/2132; B01F 35/2111
See application file for complete search history.

(56) References Cited

U.S. PATENT DOCUMENTS

| 6,050,283 | A | * | 4/2000 | Hoffman | G05D 11/135 137/5 |
| 6,884,359 | B2 | | 4/2005 | Kambe et al. | |
| 7,329,312 | B2 | | 2/2008 | Morita et al. | |

FOREIGN PATENT DOCUMENTS

| JP | 2000-208471 A | 7/2000 |
| JP | 2003-334433 A | 11/2003 |

(Continued)

OTHER PUBLICATIONS

PCT/ISA/210, "International Search Report for International Application No. PCT/JP2017/033550," dated Dec. 5, 2017.

(Continued)

*Primary Examiner* — Anshu Bhatia
(74) *Attorney, Agent, or Firm* — Manabu Kanesaka

(57) ABSTRACT

Provided are a method for supplying water of specified concentration, including: a step of adding at least two liquids, a conductive first liquid and a non-conductive second liquid, to ultrapure water to produce water of specified concentration containing a first liquid-component and a second liquid-component at specified concentrations, in which a mixed solution in which the first liquid and the second liquid are mixed at a specified mixing ratio in advance is prepared; and the mixed solution is added to the ultrapure water so that a conductivity or specific resistance of the ultrapure water after the addition satisfies a specified value, and an apparatus therefor.

4 Claims, 4 Drawing Sheets

(51) Int. Cl.
    *B01F 23/40*     (2022.01)
    *B01F 25/30*     (2022.01)
    *B01F 33/80*     (2022.01)
    *B01F 35/80*     (2022.01)
    *B01F 35/22*     (2022.01)
    *B01F 35/221*     (2022.01)
    B01F 101/58     (2022.01)
    B01F 101/00     (2022.01)

(52) U.S. Cl.
    CPC .......... *B01F 33/80* (2022.01); *B01F 35/2111* (2022.01); *B01F 35/2202* (2022.01); *B01F 35/22141* (2022.01); *B01F 35/80* (2022.01); B01F 23/483 (2022.01); B01F 33/834 (2022.01); B01F 2101/305 (2022.01); B01F 2101/58 (2022.01)

(56)     References Cited

FOREIGN PATENT DOCUMENTS

| | | |
|---|---|---|
| JP | 2004-275917 A | 10/2004 |
| JP | 2008-211096 A | 9/2008 |
| JP | 2012-63303 A | 3/2012 |
| JP | 2014-236079 A | 12/2014 |
| TW | 503124 B | 9/2002 |

OTHER PUBLICATIONS

Japan Patent Office, "Notice of Reasons for Refusal for Japanese Patent Application No. 2017-068091," dated Dec. 5, 2017.
Taiwan Patent Office, "Office Action for Taiwanese Patent Application No. 106132881," dated Sep. 26, 2020.

\* cited by examiner

METHOD AND APPARATUS FOR SUPPLYING WATER OF SPECIFIED CONCENTRATION

TECHNICAL FIELD

The present invention relates to a method and an apparatus for supplying water of specified concentration, particularly to a method and an apparatus for supplying water of specified concentration by mixing a conductive first liquid and a non-conductive second liquid and adding the mixture to ultrapure water to prepare water of a specified concentration and supply the water.

Further specifically, the present invention relates to a method and an apparatus suitable for supplying wash water containing a solute at very low concentration, such as an alkali, an oxidant or the like, which is effective in a step of washing or rinsing semiconductor wafers.

BACKGROUND ART

In a step of washing and rinsing semiconductor silicon wafers or the like, water (which is herein referred to as dilute wash water) in which a solute effective in controlling the pH or the redox potential at very low concentration is dissolved may be used in some cases. An acid or alkalis or oxidant or reductant at a minimum concentration required is added to ultrapure water as a basic material, for imparting liquid properties such as a pH and a redox potential suitable for the purpose of the step such as washing and rinsing. There is also a method in which reducible, alkaline, or acidic gases such as $H_2$, $NH_3$, and $O_3$ is dissolved in ultrapure water, but a method in which a very small amount of a chemical solution is added (injected) is also convenient and used.

Examples of the method for chemical injection include a method using a pump and a method using a closed container for compression of an inert gas such as $N_2$. Both methods are practically used.

When supplying dilute wash water, the dissolution is controlled by various techniques such as PID control by receiving signals from a concentration monitor and proportional control to the flow rate of ultrapure water, so that the solute concentration falls within a desired range. As one of chemical solutions that are often used in a step of washing semiconductors, $H_2O_2$ is mentioned, and strict control of the concentration is always required, even in the case where the flow rate used in a washing machine varies. However, $H_2O_2$ is not used alone for washing and is often used as a mixture with a chemical solution such as acids and alkalis.

A method using colorimetric titration is the mainstream of the method for measuring the concentration of $H_2O_2$, and "Process titrator AHP310" is commercially available from HIRANUMA SANGYO Co., Ltd. to be used in an online monitoring method. Further, "AL2021" similarly using the absorbance is commercially available from Aero Laser GmbH. However, these methods require use of a predetermined reagent for measurement and thus the management and adjustment of the reagent are complicated.

JP 2012-63303 A discloses quantitating the concentration of $H_2O_2$ without using reagents by decomposing hydrogen peroxide in water and measuring the concentration of oxygen dissolved. However, there have been problems that a degasifier is necessary, thereby making equipment complicated, and accurate measurement cannot be performed in the low concentration range due to the dependence on the sensitivity of a DO meter.

Thus, in the case where the flow rate used in a washing machine varies, the concentration cannot always be strictly controlled by such conventional methods. Further, PID control at the ppb level is not performed sufficiently, and the trace concentration range cannot be controlled. As a result, the liquid quality of wash water or rinse water poured to wafers has been merely controlled in a wide range, which is far from an ideal value.

There is also a simple method in which dilute wash water is produced in advance under certain conditions, stored, and continuously supplied from a storage tank, giving priority to liquid stabilization. In this case, however, a large water storage tank needs to be provided near a washing machine in a clean room in which wafers are produced, and thus such a method is not practical.

PTL 1: JP 2012-63303 A

SUMMARY OF INVENTION

It is an object of the present invention to provide a method and an apparatus for supplying water of specified concentration, which enable water of specified concentration to be efficiently produced and supplied by adding a conductive first liquid and a non-conductive second liquid at a specified concentration to ultrapure water. According to one aspect, it is an object of the present invention to provide a method and an apparatus for supplying water of specified concentration, which enable diluted wash water containing $H_2O_2$ at a specified concentration to be efficiently produced and supplied.

A method for supplying water of specified concentration of the present invention comprises: a step of adding at least two liquids, a conductive first liquid and a non-conductive second liquid, to ultrapure water, to produce the water of specified concentration containing a first liquid-component and a second liquid-component at specified concentrations, in which a mixed solution in which the first liquid and the second liquid are mixed at a specified mixing ratio in advance is prepared; and the mixed solution is added to the ultrapure water so that a conductivity or specific resistance of the ultrapure water after the addition satisfies a specified value.

An apparatus for supplying water of specified concentration of the present invention comprises: a reservoir for a mixed solution in which at least two liquids, a conductive first liquid and a non-conductive second liquid, are mixed at a specified mixing ratio; a mixed solution feeder configured to inject the mixed solution in the reservoir into ultrapure water; a conductivity meter or a resistivity meter configured to measure a conductivity or specific resistance of the ultrapure water into which the mixed solution has been injected; an instantaneous flow meter configured to measure an instantaneous flow rate of the ultrapure water into which the mixed solution has been injected; and a controller configured to control the mixed solution feeder so that a value is by the conductivity meter or the resistivity meter is a specified value.

In one aspect of the present invention, the first liquid is an aqueous solution of an acid or alkali, and the second liquid is $H_2$, $H_2O_2$, or $O_3$ dissolved water.

Advantageous Effects of Invention

According to the present invention, a mixed solution in which a conductive first liquid and a non-conductive second liquid are mixed at a specified mixing ratio in advance is added to ultrapure water so that the conductivity or specific resistance of the ultrapure water after the addition satisfies a specified value, and therefore water of specified concentration in which the first liquid and the second liquid are each added to the ultrapure water at a specified concentration can be efficiently produced.

Components dissolved in the dilute wash water include alkalis such as $NH_3$, acids such as $HCl$, $H_2SO_4$, and $HF$, oxidants such as $H_2O_2$, which are generally supplied by addition of EL-grade chemical solutions, and $O_3$, $H_2$, $CO_2$, and the like, which are supplied by gas dissolution. These are all added in the order of ppm to ppb at most to adjust the liquid quality. A conductivity meter is suitable for monitoring addition in the order of ppm online because of having good responsiveness, a simple structure, and no consumable materials, but it is difficult to detect $H_2O_2$ by a conductivity meter. Meanwhile, $NH_3$, $HCl$, $CO_2$, or the like in the order of ppm can be detected by a conductivity meter with good sensitivity. Further, in the case of monitoring addition in the order of ppb, a resistivity meter may be used instead of the conductivity meter. The resistivity meter is suitable because of having good responsiveness, a simple structure, and no consumable materials.

According to the present invention, water of specified concentration containing a first liquid-component and a second liquid-component each at a specified concentration with high accuracy can be efficiently produced by mixing a conductive first liquid the amount of addition of which can be monitored using a conductivity meter and a non-conductive second liquid which is difficult to monitor using a conductivity meter at a specified ratio in advance and monitoring the mixed solution after injection using a conductivity meter or a resistivity meter to control the amount of addition of the mixed solution.

DESCRIPTION OF EMBODIMENTS

Hereinafter, the embodiments will be described with reference to FIGS. 1 to 3.

Figure 1:
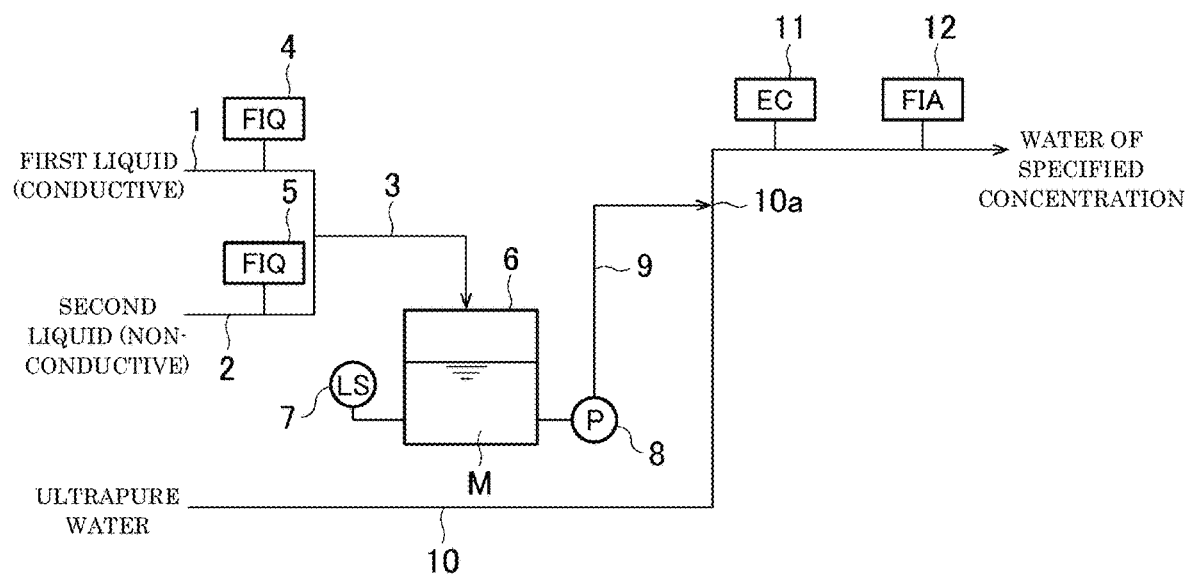
FIG. 1 is an explanatory diagram of a method and an apparatus for supplying water of specified concentration according to a first embodiment.

In FIG. 1, a conductive first liquid is introduced into a reservoir 6 via pipes 1 and 3, and a non-conductive second liquid is introduced into the reservoir 6 via pipes 2 and 3.

The supply amounts of the first liquid and the second liquid to the reservoir 6 are respectively detected by integrated flow meters 4 and 5, and a mixed solution M mixing the first liquid and the second liquid at a specified ratio is stored in the reservoir 6. The reservoir 6 is provided with a water level sensor 7.

The mixed solution M in the reservoir 6 is injected (added) into ultrapure water flowing through a pipe 10 at an injection point 10a via a pump 8 and a pipe 9. The flow rate of the ultrapure water injected is measured by an instantaneous flow meter 12 while the conductivity thereof is measured by a conductivity meter 11.

Values detected by the conductivity meter 11 and the instantaneous flow meter 12 are input into a pump control device (not shown), and the pump control device controls the pump 8 so that the value detected by the conductivity meter 11 satisfies a specified value.

The mixed solution M is a solution in which the first liquid with the second liquid are mixed at a specified ratio. Of components in the mixed solution, only the first liquid-component substantially affects the value detected by the conductivity meter 11. Therefore, when the mixed solution M is injected so that the value detected by the conductivity meter 11 satisfies a specified value, the first liquid-component in the ultrapure water after injection satisfy a specified concentration. Further, the ratio of the first liquid to the second liquid in the mixed solution M is fixed to a specified ratio (a target ratio of the first liquid-component to the second liquid-component in water with a specified concentration) in advance, and therefore the concentration of the second liquid-component in the ultrapure water after the injection also satisfies a specified concentration. Thus, water of specified concentration containing the first liquid-component and the second liquid-component at specified concentrations is produced, and the water of specified concentration is fed into a washing machine or the like in the production process of semiconductors.

Since the accuracy and the responsiveness of the conductivity meter 11 and the instantaneous flow meter 12 are exceptionally high, the difference of the concentration of each component in water of specified concentration from a target value is exceptionally small.

Examples of the first liquid include aqueous solutions of alkalis such as ammonia, tetraalkyl ammonium hydroxide, and amine, and aqueous solutions of acids such as $HCl$, $H_2SO_4$, $HF$, and $CO_2$. Examples of the second liquid include water dissolving gas such as $H_2O_2$, $H_2$, and $O_3$. The conductivity of the first liquid is generally about 0.05 to 5 mS/m. The conductivity of the second liquid is generally 0.02 mS/m or less. However, the conductivity of the second liquid is ⅕ or less of that of the first liquid. Even if the concentration of the first liquid-component in the ultrapure water to which the mixed solution M has been added is of the order of ppm, the concentration is measured by the conductivity meter with high accuracy.

In FIG. 1, the mixing ratio of the first liquid and the second liquid in the mixed solution M in the reservoir 6 is adjusted to a specified ratio by using the integrated flow meters 4 and 5. In FIG. 2, the mixed solution M with a mixing ratio a/b of the first liquid and the second liquid adjusted to a specified value is configured to be stored in the reservoir 6 by providing a weight sensor 20 in the reservoir 6, introducing a predetermined amount a of the first liquid into the reservoir 6, and thereafter (or therebefore) introducing a predetermined amount b of the second liquid into the reservoir 6. Other than the above, the configuration is the same as that in FIG. 1.

Figure 2:
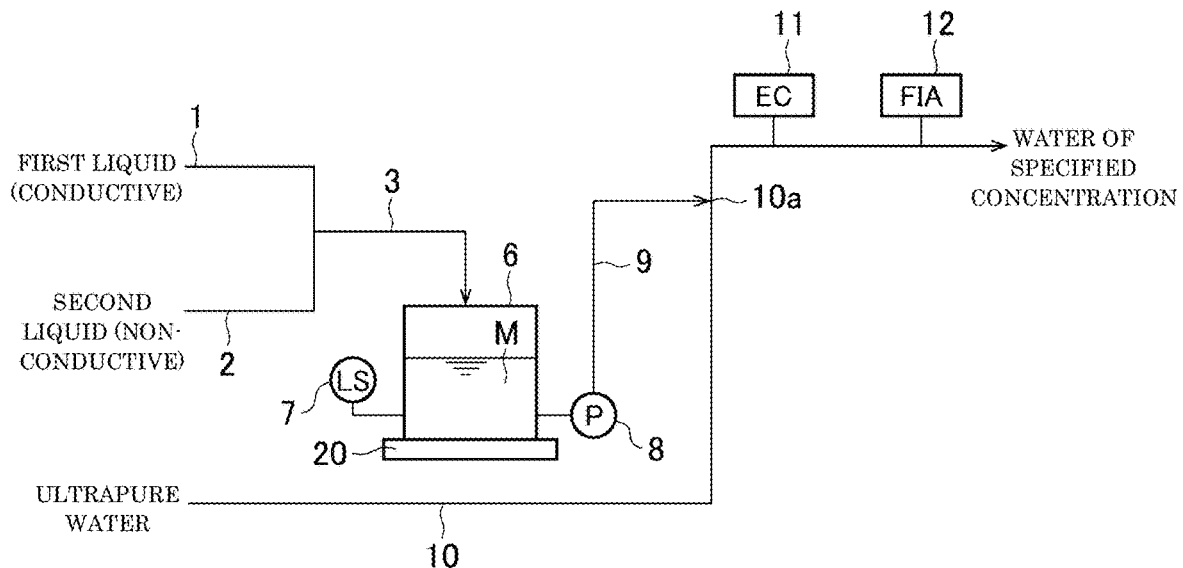
FIG. 2 is an explanatory diagram of a method and an apparatus for supplying water of specified concentration according to a second embodiment.
Figure 3:
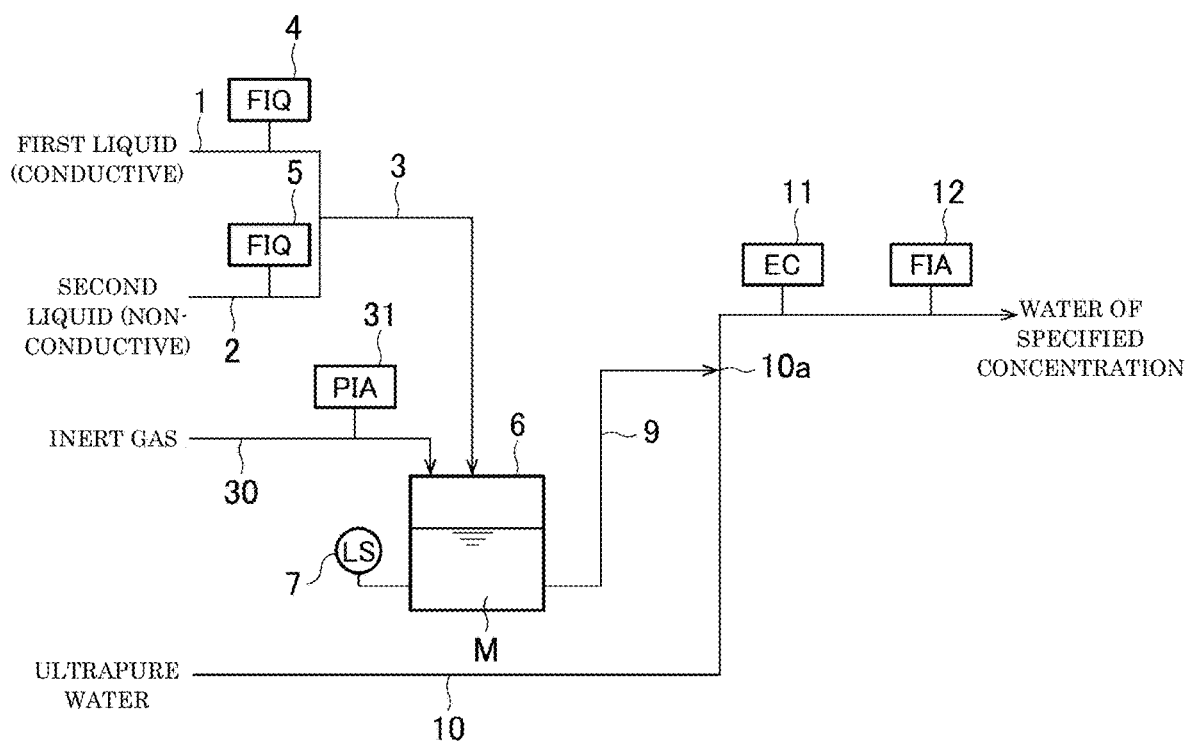
FIG. 3 is an explanatory diagram of a method and an apparatus for supplying water of specified concentration according to a third embodiment.

In FIGS. 1 and 2, the injection is performed by the pump 8, but the pump 8 may be omitted by supplying an inert gas (such as nitrogen and helium) to the reservoir 6 to inject the mixed solution M in the reservoir 6 into ultrapure water utilizing the pressure of the inert gas, as in FIG. 3. Other than the above, the configuration in FIG. 3 is the same as that in FIG. 1. FIG. 3 shows a configuration utilizing the pressure of the inert gas in the system of FIG. 1, but the system of FIG. 2 can have the same configuration.

In the present invention, a conventional injection mechanism can be used as it is. That is, the apparatus of the present invention includes: the integrated flow meters 4 and 5 used for adjusting a ratio of two different chemical solutions to a predetermined value constantly; the water level sensor 7 configured to monitor the water level of the mixed solution; the reservoir 6 configured to store the mixed solution; the feed pump 8 or an inert gas pressure pump configured to feed the solution from the reservoir 6 to the injection point 10a; the conductivity meter 11 configured to monitor the conductivity after mixing with ultrapure water; and the instantaneous flow sensor 12 configured to monitor the feeding amount of water. These devices may be of a conventional injection mechanism. A unit for removing impurities such as a filter or the like may be provided in the course of a water supply line of the water of specified concentration.

Two chemical solutions can be automatically supplied into the reservoir 6 by combining the integrated flow meters 4 and 5 with the water level sensor 7. The mixed solution M is not limited to such a mixed solution of two liquids and maybe a mixed solution of a plurality of chemical solutions of three types or more.

The concentration can be always strictly controlled even in the case where the flow rate varies by combining the feed pump 8, the conductivity meter 11, and the instantaneous flow sensor 12 to perform PID control or proportional control. The controllability is never lost depending on the viscosity and the specific gravity of the chemical solutions. Hereinbefore, the case of using the conductivity meter 11 has been described, but a resistivity meter may be used instead of the conductivity meter 11 in the case of the order of ppb.

EXAMPLES

Example 1

In the system of FIG. 1, chemical injection into ultrapure water was performed under the following conditions. Table 1 shows the results.
Amount of ultrapure water fed: 12 to 20 L/min
First liquid: 10-ppm $NH_4OH$ aqueous solution
Second liquid: 1-ppm $H_2O_2$-dissolved water
Control system of pump 8: PID
Test time: 20 minutes Example 2

Chemical injection was performed under the same conditions as in Example 1 except that the weight sensor 20 was used instead of the integrated flow meters 4 and 5 as shown in FIG. 2. Table 1 shows the results.

Example 3

Chemical injection was performed under the same conditions as in Example 1 except that the pump 8 was omitted, and the inert gas pumping system of FIG. 3 was used. Table 1 shows the results.

Example 4

In Example 3, chemical injection was performed under the same conditions except that the weight sensor 20 was used instead of the integrated flow meters 4 and 5, as shown in FIG. 2. Table 1 shows the results.

Comparative Example 1

Figure 4:
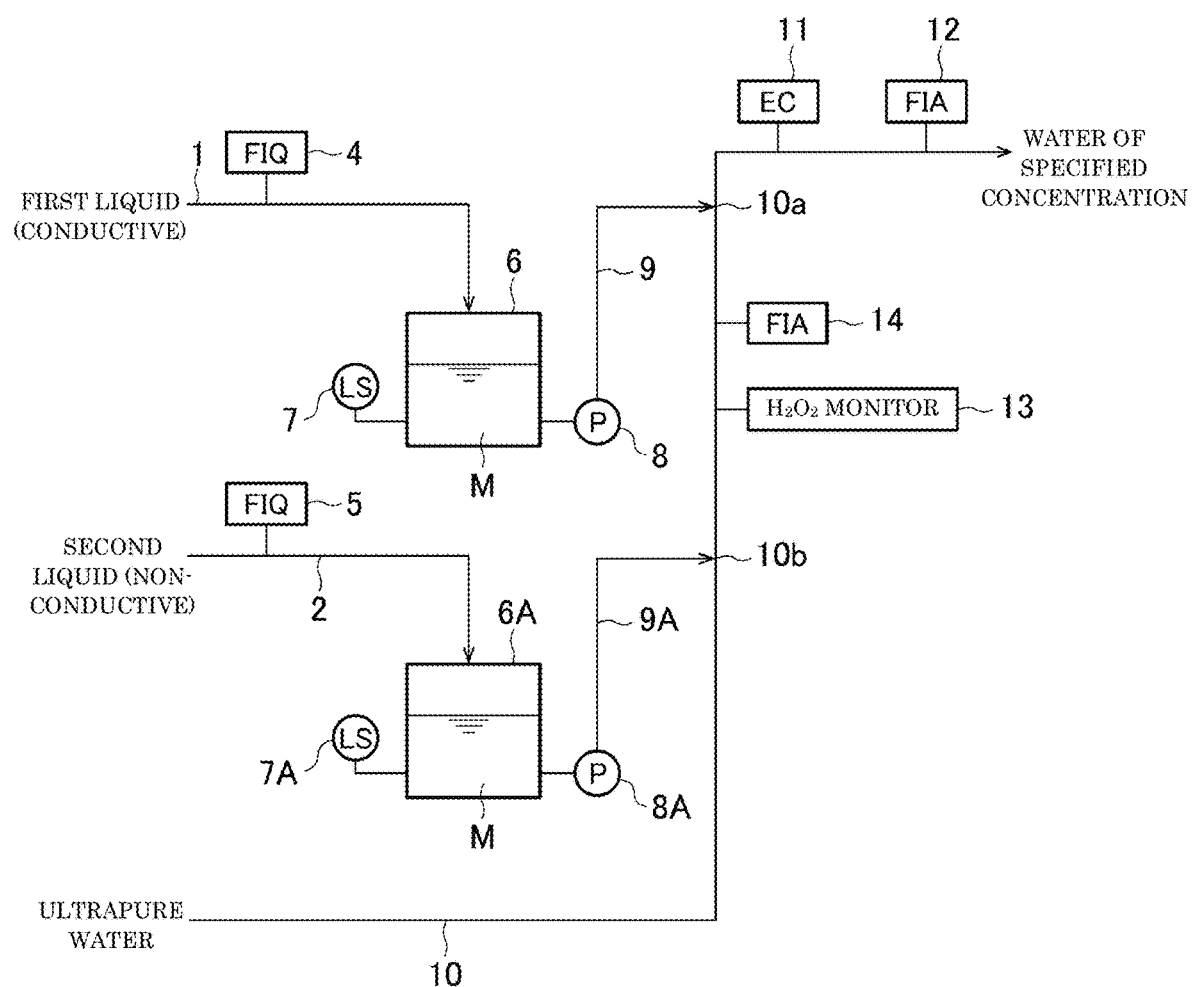
FIG. 4 is an explanatory diagram of Comparative Example.

As shown in FIG. 4, a system in which only the first liquid was supplied to the reservoir 6, only the second liquid was supplied to a second reservoir 6A that had been separately provided, the first liquid was injected at the injection point 10a via the pump 8, and the second liquid was injected at a second injection point 10b via a second pump 8A was used. The concentration of the non-conductive second liquid was measured using an online $H_2O_2$ monitor 13. The instantaneous flow rate at that time was measured using an instantaneous flow meter 14. Other than the above, chemical injection was performed under the same conditions as in Example 1. Table 1 shows the results.

TABLE 1

| Item | Unit | Set value | Example 1 | Example 2 | Example 3 | Example 4 | Comparative Example 1 |
|---|---|---|---|---|---|---|---|
| Conductivity | mS/m | 15.2 | 15 | 15.1 | 15.2 | 15.3 | 15.1 |
| In terms of $NH_4OH$ concentration | ppm | 10 | 10 | 10 | 10 | 10 | 10 |
| Variable range | % | ±1 | ±1 | ±1 | ±1 | ±1 | ±1 |
| $H_2O_2$ concentration | ppm | 1 | 1 | 1 | 1 | 1 | 1 |

As shown in Table 1, Examples 1 to 4 each have injection performance equivalent to that in conventional system provided with the reservoirs 6 and 6A.

As is obvious from Examples 1 to 4 and Comparative Example 1 above, use of values measured by the conductivity meters for PID control enables stable supply of non-conductive $H_2O_2$ that is difficult to measure and a conductive chemical solution, with liquid quality exceptionally important in a washing or rinsing step, accurately and stably adjusted to a desired value. Further, also in the case of proportional control, stable supply is enabled by reflecting the measurement results by the conductivity meters to adjust the injection amount.

Experimental Example 1

Figure 5:
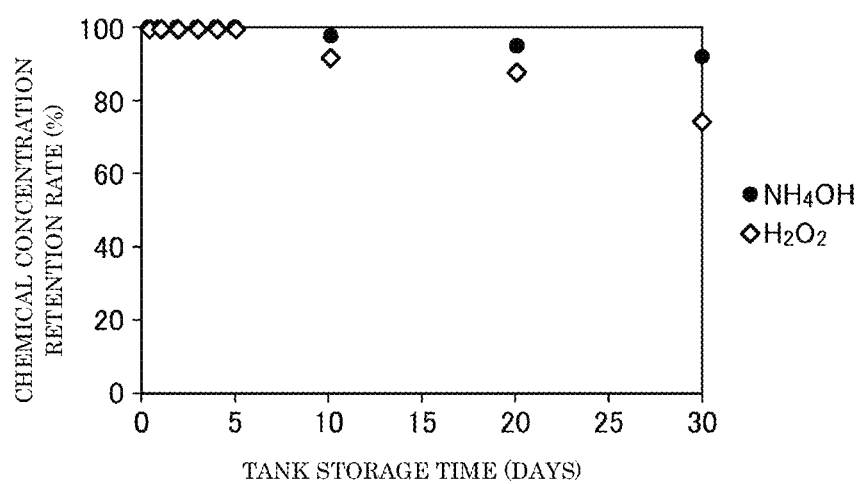
FIG. 5 is a graph showing the experimental results.

The self-degradability of each component in the following concentrated chemical solutions (mixed solution) in a storage tank was measured under the following conditions. FIG. 5 shows the results.
Volume of tank: 10 L
$NH_4OH$ concentration: 25 wt %
$H_2O_2$ concentration: 30 wt %
Outdoor air temperature: 25° C.
Storage period: One month
Detection method: Colorimetric titration As shown in FIG. 5, it turned out that, even in the state where the concentrated chemical solutions were mixed, the concentrations were constant for 5 days. From above, it was revealed that a tank and an injection point do not need to be provided for each chemical solution by designing the amount to be stored in the tank so as to be depleted within 5 days. Further, it was recognized that the problem that the amount stored in the tank falls below a predetermined value can be overcome by replenishing each chemical solution using an integrated flow meter or a weight meter.

Although the present invention has been described in detail using specific embodiments, it will be apparent to those skilled in the art that various modifications are possible without departing from the spirit and scope of the invention. This application is based on Japanese Patent Application No. 2017-068091 filed on Mar. 30, 2017, which is incorporated by reference in its entirety.

REFERENCE SIGNS LIST 4, 5: Integrated flow meter
6, 6A: Reservoir
11: Conductivity meter
13: $H_2O_2$ monitor
12, 14: Instantaneous flow meter

The invention claimed is:

1. A method for supplying water of specified concentration, comprising:
   supplying a conductive first liquid-component to a reservoir while measuring an amount thereof;
   supplying a non-conductive second liquid-component to the reservoir while measuring an amount thereof, to thereby produce in the reservoir a mixed solution with a specified concentration containing the first liquid-component and the second liquid-component;
   adding the mixed solution in the reservoir to ultrapure water flowing through a line;
   measuring a conductivity or specific resistance of the ultrapure water in the line into which the mixed solution has been added;
   measuring an instantaneous flow rate of the ultrapure water in the line into which the mixed solution has been added; and
   controlling an amount of the mixed solution in the reservoir added to the line so that a value of the conductivity or the specific resistance is a specified value.

2. The method for supplying water of specified concentration according to claim 1, wherein
   the first liquid is an aqueous solution of an acid or alkali, and
   the second liquid is $H_2$, $H_2O_2$, or $O_3$-dissolved water.

3. An apparatus for supplying water of specified concentration, comprising:
   a reservoir;
   a conductive first liquid line providing a predetermined amount of a conductive first liquid to the reservoir;
   a conductive second liquid line providing a predetermined amount of a non-conductive second liquid to the reservoir, to thereby prepare in the reservoir a mixed solution of the conductive first liquid and the non-conductive second liquid at a specified mixing ratio;
   a mixed solution feeder configured to supply the mixed solution in the reservoir into ultrapure water;
   a conductivity meter or a resistivity meter configured to measure a conductivity or specific resistance of the ultrapure water into which the mixed solution has been supplied;
   an instantaneous flow meter configured to measure an instantaneous flow rate of the ultrapure water into which the mixed solution has been supplied; and
   a controller configured to control the mixed solution feeder so that a value detected by the conductivity meter or the resistivity meter is a specified value.

4. The apparatus for supplying water of specified concentration according to claim 3, wherein
   the first liquid is an aqueous solution of an acid or alkali, and
   the second liquid is $H_2$, $H_2O_2$, or $O_3$-dissolved water.

* * * * *